United States Patent [19]

Harazono

[11] Patent Number: 5,744,848

[45] Date of Patent: Apr. 28, 1998

[54] PACKAGE FOR HOUSING A PHOTOSEMICONDUCTOR DEVICE

[75] Inventor: Masaaki Harazono, Kokubu, Japan

[73] Assignee: Kyocera Corporation, Kyoto, Japan

[21] Appl. No.: 691,624

[22] Filed: Aug. 2, 1996

[30] Foreign Application Priority Data

Aug. 9, 1995 [JP] Japan ..................... 7-203100

[51] Int. Cl.[6] ........................... H01L 23/06
[52] U.S. Cl. ............ 257/433; 257/705; 257/782
[58] Field of Search ......................... 257/709, 705, 257/433, 678, 116, 782

[56] References Cited

U.S. PATENT DOCUMENTS

| | | | |
|---|---|---|---|
| 4,585,300 | 4/1986 | Landis et al. | 257/433 |
| 5,132,532 | 7/1992 | Watanabe | 257/433 |

*Primary Examiner*—Tom Thomas
*Assistant Examiner*—Roy Potter
*Attorney, Agent, or Firm*—Loeb & Loeb LLP

[57] ABSTRACT

A photosemiconductor device-housing package comprising a metal substrate; an insulating support member on the top surface of which a photosemiconductor device is mounted; a metal frame member attached onto the metal substrate so as to surround the insulating support member and having a fixing region through its side face which fixes an optical fiber therein; outer lead terminals fixed in the metal substrate or the metal frame member via insulants; and a metal lid member attached to the top surface of the metal frame member to hermetically seal the photosemiconductor device, wherein the insulating support member is composed of an aluminum nitride-based sinter, the top surface of the insulating support member is coated with a thin-film brazing material, and the photosemiconductor device is fixed onto the insulating support member via the brazing material.

4 Claims, 1 Drawing Sheet

PACKAGE FOR HOUSING A PHOTOSEMICONDUCTOR DEVICE

BACKGROUND OF THE INVENTION

1. Field of the Invention

The present invention relates to a package for housing a photosemiconductor, and more particularly to a package for housing a photosemiconductor capable of hermetically sealing a photosemiconductor device and holding an optical fiber for receiving optical signals from the photosemiconductor device.

2. Description of the Related Art

Conventional packages for housing photosemiconductor devices generally comprise metal substrates composed of metal materials such as copper, iron-nickel-cobalt alloys or iron-nickel alloys; insulating support members which are attached onto the metal substrates, have photosemiconductor devices on their top surfaces, and are composed of insulating materials such as aluminum oxide-based sinters; metal frame members which are attached onto the metal substrates so as to surround the insulating support members and have fixing regions for fixing optical fibers through their side faces; outer lead terminals fixed to the metal substrates or the metal frame members via insulants; and metal lid members which are attached to the top surfaces of the metal frame members to hermetically seal the photosemiconductor devices. The photosemiconductor device-housing packages are processed into photosemiconductor apparatuses as final products by brazing the photosemiconductor devices onto the insulating support members while establishing connections between respective electrodes of the photosemiconductor devices and the outer lead terminals via bonding wires, attaching the metal lid members to the top surfaces of the metal frame members, housing the photosemiconductor devices in the insides of containers composed of the metal substrates, the metal frame members and the metal lid members, and finally joining flanges attached to the optical fibers to the optical fiber-fixing regions provided through the side faces of the metal frame members by welding through irradiation with laser light to fix the optical fibers penetrating through the side faces of the metal frame members.

Such photosemiconductor apparatuses are designed to function as photosemiconductor apparatuses for high-speed optical communications in such a manner that the photosemiconductor devices excite optical signals in response to driving signals fed from external electric circuits, and the excited optical signals are transmitted to the outside via the optical fibers.

With such a photosemiconductor device-housing package as described above, the top surface of the insulating support member is coated with backing metal layers comprising metallizing metal films (e.g., of MoW) and overlying foils or thick-films of brazing materials composed of silver-copper alloys which are of dimensions equal to or somewhat greater than the dimensions of the photosemiconductor device. As described above, the photosemiconductor device is brazed to the backing metal layers on the top surface of the insulating support member through the use of a brazing material so as to attach the photosemiconductor device onto the insulating support member.

With such a photosemiconductor device-housing package of the prior art as described above, however, since the foils or thick-films of the brazing materials are as thick as approximately 50 μm, the brazing material cannot uniformly melt during the brazing, and this often causes a phenomenon in which the photosemiconductor device cannot be placed horizontally to the top surface of the insulating support member, and thus is attached thereto at an angle (the so-called "cantilever phenomenon"). Attachment of the bottom surface of the insulating support member to the metal substrate via the backing metal layers may cause the same phenomenon, since the attachment is often accomplished through brazing with the foils or the thick films of a brazing material. When the photosemiconductor device is placed at an angle from the insulating support member or the metal substrate, the photosemiconductor device cannot be located in the proper, predetermined positional relationship with the optical fibers, as will be described later, and this results in failure to transmit the excited optical signals to the optical fibers with accuracy.

In addition, with the photosemiconductor device-housing package of the prior art, since the insulating support member to which the photosemiconductor device is brazed is composed of aluminum oxide-based sinters, and the coefficients of thermal conductivity of the aluminum oxide-based sinters are as low as approximately 20 W/mK, heat which may be generated when the photosemiconductor device is driven to excite light is accumulated in the photosemiconductor device itself, without being efficiently transmitted to the outside via the insulating support member, and this eventually results in the disadvantage of increased temperatures of the photosemiconductor device, causing thermal breakage thereof or thermal change in the properties, ultimately leading to malfunction.

An additional disadvantage is that when a brazing material comprising gold-tin alloys with more excellent wettability than silver-copper alloys is used to braze the photosemiconductor device to the insulating support member, tin oxides are readily formed on the surfaces of the brazing material, lowering the wettability of the brazing material, and thus the photosemiconductor device must be greatly scribed exerting a force thereon during the brazing.

In addition, gold-tin alloy bodies are formed outside the photosemiconductor device when the greatly scribed photosemiconductor device is attached to the insulating support member by brazing, irregular refraction of the optical signals excited by the photosemiconductor device is caused by the gold-tin alloy bodies, and this is disadvantageous in that it prevents normal transmission of the optical signals to the optical fibers.

SUMMARY OF THE INVENTION

The present invention is a photosemiconductor device-housing package which comprises a metal substrate; an insulating support member on the top surface of which a photosemiconductor device is mounted; a metal frame member attached onto the metal substrate so as to surround the insulating support member and having a fixing region through its side face which fixes an optical fiber therein; outer lead terminals fixed in the metal substrate or the metal frame member via insulants; and a metal lid member attached to the top surface of the metal frame member to hermetically seal the photosemiconductor device, characterized in that the insulating support member is composed of an aluminum nitride-based sinter, the top surface of the insulating support member is coated with a thin-film brazing material, and the photosemiconductor device is fixed onto the insulating support member via the brazing material.

The present invention is further characterized in that the surface of the thin-film brazing material is coated with a gold film.

The present invention is further characterized in that the thin-film brazing material is composed of a gold-tin alloy, and the thickness of the gold film coating the thin-film brazing material is from about 0.05 μm to about 0.2 μm.

An additional characteristic aspect of the present invention is that the outside dimensions of the thin-film brazing material and the gold film are smaller than the outside dimension of the photosemiconductor device by about 20 μm to about 100 μm.

With the photosemiconductor device-housing package according to the invention, since the insulating support member on which a photosemiconductor device is mounted is composed of an aluminum nitride-based sinter with a coefficient of thermal conductivity of 55–250 W/mK, the heat which is generated by driving of the photosemiconductor device is efficiently dissipated to the outside via the insulating support member and the metal substrate, and thus the photosemiconductor device is kept at an appropriate temperature at all times, allowing long-term, normal, stable operation of the photosemiconductor device.

Also, with the photosemiconductor device-housing package according to the invention, since the thin-film brazing material is applied onto the insulating support member, and the photosemiconductor device is fixed onto the insulating support member by brazing through the use of the brazing material, the "cantilever phenomenon" of the photosemiconductor device with respect to the metal substrate during the brazing is prevented, and this allows exact positioning of the photosemiconductor device so as to face the optical fiber. Accordingly, optical signals outputted from the photosemiconductor device to the optical fiber may be accurately transmitted along a predetermined direction as designed for the package.

Also, with the photosemiconductor device-housing package according to the invention, since the thin-film brazing material and the gold film coating the thin-film brazing material are applied onto the insulating support member, the chemically stable gold film effectively prevents formation of oxides on the thin-film brazing material, and this improves the wettability of the thin-film brazing material and allows attachment of a photosemiconductor onto the insulating support member by brazing in a simple manner.

Also, with the photosemiconductor device-housing package according to the invention, in cases where the outside dimensions of the thin-film brazing material which is attached onto the insulating support member and the gold film which coats the thin-film brazing material are designed to be smaller than the outside dimension of the photosemiconductor device, there is no risk of forming a body of the brazing material outside the photosemiconductor device after the photosemiconductor device has been brazed onto the insulating support member, and this allows constant, normal transmission of optical signals excited by the photosemiconductor device to an optical fiber, without causing irregular reflection of the optical signals excited by the photosemiconductor device by the brazing material body.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
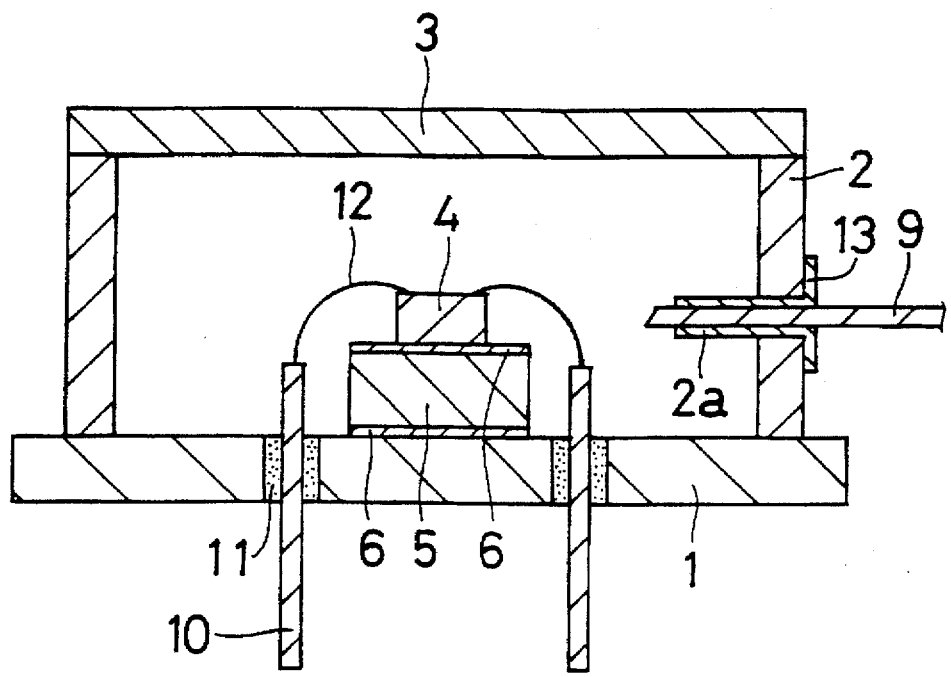
FIG. 1 is a cross sectional view illustrative of an embodiment of the photosemiconductor device-housing package according to the present invention.

Now referring to the drawings, preferred embodiments of the invention are described below.

Figure 2:
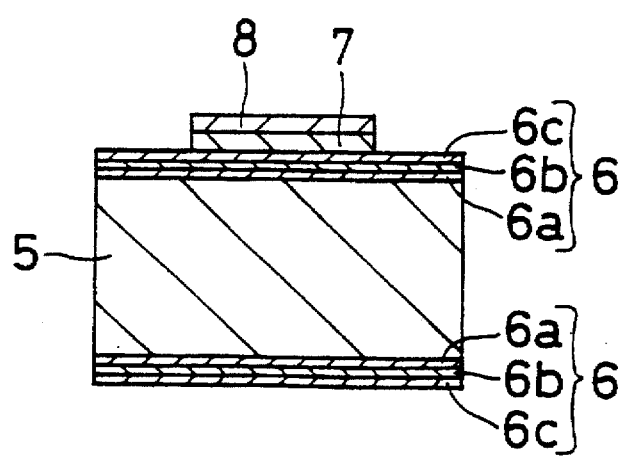
FIG. 2 is an enlarged cross-sectional view illustrative of the main portion of the photosemiconductor device-housing package shown in FIG. 1.

FIG. 1 and FIG. 2 illustrate an embodiment of the photosemiconductor device-housing package according to the invention, wherein 1 indicates a metal substrate, 2 indicates a metal frame member, and 3 indicates a metal lid member. These metal substrate 1, metal frame member 2 and metal lid member 3 constitute a container for housing a photosemiconductor 4 in the inside.

The metal substrate 1 functions as a holding member for holding the photosemiconductor device 4, on the top surface of which is mounted the photosemiconductor device 4 via an intervening insulating support member 5. Thus, the insulating support member supports the photosemiconductor device in a state electrically isolated from the metal substrate 1.

The metal substrate 1 is composed of a metal material such as copper, an iron-nickel-cobalt alloy or a copper-tungsten alloy, and is formed by, for example, shaping an ingot (mass) of copper into a plate of a predetermined configuration by a well-known metalworking technique of the prior art, such as rolling or press-cutting.

The insulating support member 5 is composed of an aluminum nitride-based sinter, and since the aluminum nitride-based sinter has a coefficient of thermal conductivity of 55–250 W/mK, the heat which may be generated by driving of the photosemiconductor device 4 mounted on the insulating support member 5 is transmitted to the metal substrate 1 via the insulating support member 5 and is dissipated into the air via the metal substrate 1. As a result, the photosemiconductor device 4 is kept at an appropriate temperature at all times, and this allows longterm, normal, stable operation of the photosemiconductor device 4.

Here, the insulating support member 5 composed of an aluminum nitride-based sinter is produced by preparing a starting material powder by mixing an aluminum nitride powder as the main raw material with a powder of yttrium oxide, calcia or the like as the sintering aid, an appropriate organic binder and a solvent, then charging the starting material powder into a predetermined mold to be pressed under a predetermined pressure to form a molded article and finally sintering the molded article at a temperature on the order of 1800° C.

Both the top and bottom surfaces of the insulating support member 5 are coated with respective metal layers 6 by a thin-film forming process; the metal layer 6 coating the bottom surface of the insulating support member 5 functions as the backing metal layer when the insulating support member 5 is attached onto the metal substrate 1 by brazing, with the insulating support member 5 being fixed to the top surface of the metal substrate 1 at a predetermined place by bonding the metal layer 6 on the bottom surface of the insulating support member 5 and the metal substrate 1 with a brazing material composed of a gold-tin alloy, for example, while the metal layer 6 covering the top surface of the insulating support member 5 functions as the backing metal layer when the photosemiconductor device 4 is brazed to the insulating support member 5, with the photosemiconductor device 4 being fixed onto the insulating support member 5 by brazing the metal layer 6 on the top surface of the insulating support member 5 and the photosemiconductor device 4 with a brazing material composed of a gold-tin alloy.

As shown in FIG. 2, the metal layers 6 coating the top and the bottom surfaces of the insulating support member 5 each consist of a 0.1 µm-thick titanium layer 6a, 0.2 µm-thick platinum layer 6b and a 0.5 µm-thick gold layer 6c, the layers being formed on both the top and the bottom surfaces of the insulating support member 5 by applying titanium, platinum and gold thereto in succession by a well-known thin-film forming technique of the prior art, such as sputtering, ion plating or vapor deposition. Since the respective metal layers are applied by a thin-film forming technique, the total thickness of the three layers 6a, 6b and 6c is approximately 1 µm at the thickest, and thus no cantilever phenomenon is produced during brazing.

Also, the metal layer 6 coating the top surface of the insulating support member 5 is coated with a thin-film brazing material layer 7 composed of a gold-tin alloy and a gold film 8 which coats the thin-film brazing material layer 7; the thin-film brazing material layer 7 serves to attach the photosemiconductor device 4 to the metal layer 6 applied to the top surface of the insulating support member 5 by brazing, and the gold film 8 serves to effectively prevent formation of an oxide film on the thin-film brazing material layer 7.

Since the thin-film brazing material layer 7 is composed of a gold-tin alloy, for example, and particularly its surface is coated with the chemically stable gold film 8 according to a preferred embodiment, no oxide film is formed on the thin-film brazing material layer 7, and therefore, by mounting the photosemiconductor device 4 on the top surface of the thin-film brazing material layer 7 under a weight of 80 g while applying heat at 840°–860° C. to the composite for approximately 80 seconds, the photosemiconductor device 4 is easily attached onto the insulating support member 5 through brazing without significantly scribing the photosemiconductor device 4. Attachment of the photosemiconductor device 4 onto the insulating support member layer 5 is thus accomplished through brazing in a very simple manner.

Here, the thin-film brazing material layer 7 is formed by applying an gold-tin alloy onto the metal layer 6 on the top surface of the insulating support member 5 to a thickness of 2 µm to 6 µm by a well-known vapor deposition process of the prior art, and the gold film 8 is formed on the surface of the thin-film brazing material layer 7 to a thickness of 0.05 µm to 0.2 µm by ion plating or sputtering. Since the thickness of the thin-film brazing material layer 7 is only about one tenth or less of the thickness of the thick-film brazing material layer of the prior art, no "cantilever" phenomenon is produced when the photosemiconductor device 4 is brazed to the insulating support member 5, as mentioned above.

In cases where the outside dimensions of the thin-film brazing material layer 7 and the gold film 8 coating the thin-film brazing material layer 7 are designed to be about 20–100 µm smaller than the outside dimension of the photosemiconductor device 4, there is no risk of forming a body of the brazing material outside the photosemiconductor device 4 after the photosemiconductor device 4 has been brazed to the insulating support member 5, and this allows constant, normal transmission of optical signals excited by the photosemiconductor device 4 to an optical fiber 9 which will be described later, without causing irregular reflection of the optical signals excited by the photosemiconductor device 4 by the brazing material body.

In addition, when the thickness of the gold film 8 is smaller than 0.05 µm, it is difficult to completely coat the thin-film brazing material 7, creating the risk of oxide-film formation on the thin-film brazing material layer 7, whereas for thicknesses over 0.2 µm, the gold film 8 diffuses into the thin-film brazing material layer 7, increasing the melting point of the thin-film brazing material layer 7 and further impairing its flowability, and this may become an obstacle to firm attachment of the photosemiconductor device 4. In conclusion, the thickness of the gold film 8 is preferably designed to be within a range of 0.05 µm to 0.2 µm.

A plurality of outer lead terminals 10 are fixed around the insulating support member 5, penetrating through the metal substrate 1 with the insulating support member 5 attached to the top surface thereof, sheathed in fixing insulants made of glass or the like.

The outer lead terminals 10 function to establish electric connections between respective electrodes of the photosemiconductor device 4 and external electric circuits, with one ends of the terminals 10 being connected to the electrodes of the photosemiconductor device 4 via bonding wires 12, and with the other ends of the terminals 10 being connected to the external electric circuits via brazing materials such as solder.

Specifically, the outer lead terminals 10 are composed of a metal material such as an iron-nickel-cobalt alloy or an iron-nickel alloy, and their fixation to the metal substrate 1 is accomplished by drilling holes into the metal substrate 1 which have diameters somewhat greater than the sizes of the outer lead terminals 10, inserting both an insulant 11 made of glass or the like and the outer lead terminals 10 and then heating the insulant 11.

In addition, placement of plating metal layers, such as nickel-plating layers or gold-plating layers, which have high corrosion resistance and excellent wettability with the brazing material, on the surfaces of the outer lead terminals 10 to a thickness of 1 µm to 20 µm allows not only effective prevention of oxidative corrosion of the outer lead terminals 10, but also firm connection between the outer lead terminals 10 and the bonding wires 12. Accordingly, the outer lead terminals 10 preferably have, on their surfaces, 1.0 µm to 20 µm-thick plating-metal layers, such as nickel plating layers or gold plating layers, which have high corrosion resistance and excellent wettability with the brazing material.

Further, a metal frame member 2 is joined to the top surface of the metal substrate 1 so as to surround the insulating support member 5, thereby leaving a space for accommodating the photosemiconductor device 4 in the inside.

More specifically, the metal frame member 2 is composed of a metal material such as copper, an iron-nickel-cobalt alloy or an iron-nickel alloy, and is joined to the top surface of the metal substrate i via a brazing material such as silver solder so as to surround the insulating support member 5 on the top surface of which the photosemiconductor 4 is mounted.

The metal frame member 2 is provided with a through-hole 2a drilled in a side face thereof, and this through-hole 2 functions as the fixing region to fix the optical fiber 9; the tip of the optical fiber 9 is inserted into the through-hole 2a, opposite the photosemiconductor device 4, and a flange 13 attached to the optical fiber 9 is joined and fixed to the metal frame member 2 by welding through irradiation with laser light to secure the attachment of the optical fiber 9 to the metal frame member 2.

The optical fiber 9 attached to the metal frame member 2 receives optical signals from the photosemiconductor device 4, and serves to transmit optical signals excited by the photosemiconductor device 4 to the outside.

Furthermore, a metal lid member 3 made of a metal material such as copper, an iron-nickel-cobalt alloy or an iron-nickel alloy is joined to the top surface of the metal frame member 2, and this configuration allows hermetical sealing of the photosemiconductor device 4 in the inside of the container comprised of the metal substrate 1, the metal frame member 2 and the metal cover member 3.

The joining of the metal lid member 3 onto the top surface of the metal frame member 2 is accomplished by welding according to a seam welding process or the like.

Finally, the photosemiconductor device-housing package according to the invention is assembled into a photosemiconductor apparatus as the final product by attaching the photosemiconductor device 4 onto the insulating support member 5 mounted on the top surface of the metal substrate 1 by brazing while establishing electrical connections between the respective electrodes of the photosemiconductor device 4 and the outer lead terminals 10 via the bonding wires 12, then joining the metal lid member 3 to the top surface of the metal frame member 2, hermetically housing the photosemiconductor device 4 in the inside of the container composed of the metal substrate 1, the metal frame member 2 and the metal lid member 3, and finally attaching the optical fiber 9 to the optical fiber-fixing region of the metal frame member 2; the photosemiconductor apparatus is designed so that the photosemiconductor device 4 excites light in response to driving signals fed from an external electric circuit, and the excited optical signals are sent to the optical fiber 9 and transmitted through the optical fiber 9 for high-speed optical communications, etc.

It is noted that the present invention is not limited to the embodiment described above, and may be changed or modified in a variety of ways without departing from the gist and the scope of the invention. For example, the outer lead terminals, which are provided penetrating through the metal substrate 1 according to the embodiment described above, may be provided penetrating through the metal frame member 2, while the metal substrate 1 and the metal frame member 2, which are separately prepared according to the embodiment described above, may be formed integrally.

What is claimed is:

1. A package for housing a photosemiconductor device comprising:

a metal substrate; an insulating support member on the top surface of which a photosemiconductor device is mounted; a metal frame member attached onto the metal substrate so as to surround the insulating support member and having a fixing region through a side face thereof which fixes an optical fiber therein; outer lead terminals fixed in the metal substrate or the metal frame member via insulants; and a metal lid member attached to the top surface of the metal frame member to hermetically seal the photosemiconductor device, wherein the insulating support member comprises an aluminum nitride-based sinter, the top surface of the insulating support member is coated with a thin-film brazing material, and the photosemiconductor device is fixed onto the insulating support member via the brazing material.

2. The package for housing a photosemiconductor device according to claim 1, wherein the surface of the thin-film brazing material is coated with a gold film.

3. The package for housing a photosemiconductor device according to claim 2, wherein the thin-film brazing material comprises a gold-tin alloy, and the thickness of the gold film coating the thin film brazing material is from about 0.05 µm to about 0.2 µm.

4. The package for housing a photosemiconductor device according to claim 2, wherein the outside dimensions of the thin-film brazing material and the gold film are smaller than the outside dimension of the photosemiconductor device by about 20 µm to about 100 µm.

\* \* \* \* \*